United States Patent
Gonzalez et al.

(10) Patent No.: US 7,060,599 B2
(45) Date of Patent: *Jun. 13, 2006

(54) METHOD OF FORMING SHALLOW DOPED JUNCTIONS HAVING A VARIABLE PROFILE GRADATION OF DOPANTS

(75) Inventors: Fernando Gonzalez, Boise, ID (US); Randhir Thakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/804,578

(22) Filed: Mar. 19, 2004

(65) Prior Publication Data

US 2004/0222462 A1    Nov. 11, 2004

Related U.S. Application Data

(63) Continuation of application No. 09/981,549, filed on Oct. 17, 2001, now Pat. No. 6,717,211, which is a continuation of application No. 09/196,515, filed on Nov. 20, 1998, now Pat. No. 6,359,310, which is a continuation of application No. 08/654,573, filed on May 29, 1996, now abandoned.

(51) Int. Cl.
    *H01L 21/425* (2006.01)
    *H01L 21/8238* (2006.01)

(52) U.S. Cl. .................... 438/527; 438/231

(58) Field of Classification Search .......... 438/527, 438/231, 346; 257/344, 408
See application file for complete search history.

(56) References Cited

U.S. PATENT DOCUMENTS

| | | | |
|---|---|---|---|
| 4,769,686 A | 9/1988 | Horiuchi et al. | |
| 4,835,740 A | 5/1989 | Sato | |
| 4,907,048 A | 3/1990 | Huang | |
| 5,006,477 A | 4/1991 | Farb | |
| 5,045,901 A | 9/1991 | Komori et al. | |
| 5,091,763 A | 2/1992 | Sanchez | |
| 5,334,870 A * | 8/1994 | Katada et al. | 257/344 |
| 5,352,914 A | 10/1994 | Farb | |
| 5,434,440 A | 7/1995 | Yoshitomi et al. | |
| 5,530,276 A | 6/1996 | Iwasa | |
| 5,897,363 A * | 4/1999 | Gonzalez et al. | 438/527 |
| 6,010,927 A | 1/2000 | Jones, Jr. et al. | |

OTHER PUBLICATIONS

Shu Qin, et al., "Plasma Immersion Ion Implantation Doping Experiments for Microelectronics," pp. 962–968, J. Vac. Sci. Technol. B 12(2), Mar./Apr. 1994.

Shu Qin, et al., "Plasma Immersion Ion Implantation Doping Experiments for Microelectronics," pp. 962–968, J. Vac. Sci. Technol. B 12(2), Mar./Apr. 1994.

* cited by examiner

*Primary Examiner*—Steven Loke
(74) *Attorney, Agent, or Firm*—TraskBritt

(57) ABSTRACT

Disclosed is an electrical device having, and a process for forming, a shallow junction with a variable concentration profile gradation of dopants. The process of the present invention includes first providing and masking a surface on an in-process integrated circuit wafer on which the shallow junction is to be formed. Next, a low ion velocity and low energy ion bombardment plasma doping or PLAD operation is conducted to provide a highly doped inner portion of a shallow junction. In a further step, a higher ion velocity and energy conventional ion bombardment implantation doping operation is conducted using a medium power implanter to extend the shallow junction boundaries with a lightly doped outer portion. In various embodiments, the doping steps can be performed in reverse order. In addition, an anneal step can be performed after any doping operation.

14 Claims, 2 Drawing Sheets

METHOD OF FORMING SHALLOW DOPED JUNCTIONS HAVING A VARIABLE PROFILE GRADATION OF DOPANTS

CROSS-REFERENCE TO RELATED APPLICATIONS

This application is a continuation of application Ser. No. 09/981,549, filed Oct. 17, 2001, now U.S. Pat. No. 6,717,211, issued Jun. 6, 2004, which is a continuation of application Ser. No. 09/196,515, filed on Nov. 20, 1998, now U.S. Pat. No. 6,359,310, issued Mar. 19, 2002, which is a continuation of application Ser. No. 08/654,573, filed on May 29, 1996, now abandoned, each of the foregoing being incorporated herein by reference in their entirety.

BACKGROUND OF THE INVENTION

1. The Field of the Invention

The present invention is directed to the manufacture of integrated circuits. More particularly, the present invention is directed to shallow junctions formed on in-process integrated circuit wafers and to methods of forming the shallow junctions using plasma doping.

2. The Relevant Technology

The semiconductor industry is in the midst of a movement toward greater integrated circuit densification and miniaturization. Resulting from this movement is the development of highly compact and efficient semiconductor devices, attended by an increase in the complexity and number of such semiconductor devices that can now be successfully aggregated on a single integrated circuit wafer. These benefits have, in turn, resulted in the availability of more compact and efficient integrated circuits, and in the lower cost of these integrated circuits.

The greater miniaturization and densification of semiconductor devices, including resistors, capacitors, diodes, and transistors, has been achieved, in part, by a reduction in the scale of the various components of the semiconductor devices. Among the components which have been reduced in scale as part of the miniaturization and densification movement are junctions which are formed by doping silicon substrates located on integrated circuit wafers. These junctions are used to form source and drain regions of MOS transistors, among other things, and comprise regions of silicon which are doped with dopants such as boron and phosphorous. The dopants allow silicon, normally only a semiconducting material, to conduct current through the addition of either electrons or electron holes, depending on the dopant type.

Reducing the depth of a junction in the silicon substrate helps in producing an integrated circuit with a resultant high circuit density, high speed, and low power consumption, and thereby aids in the miniaturization and densification of integrated circuits.

One area of recent progress in the formation of junctions is the development of a doping process known as plasma doping, or "PLAD." PLAD is a process involving the use of a plasma to assist in doping at a lower ion bombardment velocity and energy than conventional ion bombardment implantation doping processes which do not operate in a plasma. The plasma in the PLAD operation is biased with an energy relative to the silicon substrate that drives the dopants into the silicon substrate. PLAD results in a shallow doped junction that has a higher concentration of dopants than can be provided by conventional ion bombardment implantation doping processes. With PLAD processing, the shallow and heavily doped junctions allow the contacts or interconnects to be made correspondingly small. The higher concentration of dopants at the surface of the junction has an advantageous resistivity where the junction is connected to other structures through a contact or interconnect. When so doing, the shallow junction with a high concentration of dopants forms an interface with the contact or interconnect that has a lower resistivity than would be otherwise formed.

The shallow junction with a high dopant concentration formed in the PLAD process allows greater miniaturization and densification of the integrated circuit being formed, due to the capability of forming a contact or interconnect to the junction with a high degree of miniaturization and yet a low resistance interface. Nevertheless, the PLAD processes used to produce shallow junctions still exhibit certain problems.

Several of the problems encountered with PLAD processes are illustrated by the MOS transistor structure under formation in FIG. 1. FIG. 1 shows a step in the process of forming a MOS transistor structure in which a gate region 14 has been formed on a semiconductor substrate 10. Portions of semiconductor substrate 10 at the sides of gate region 14 have been doped through a gate oxide layer 12 with a PLAD process. The PLAD process has formed junctions 16 which are to serve as source and drain regions on the completed MOS transistor. Junctions 16 exhibit a high doping concentration that is relatively consistent and terminates abruptly at a bottom component 16a of each junction 16.

As PLAD is not highly selective of the atoms being driven into semiconductor substrate 10, heavier atoms within a carrier gas are driven into semiconductor substrate 10 with a greater force than dopant atoms, and are consequently driven to a greater depth. This inconsistency in depth causes a jagged unevenness to bottom component 16a of junctions 16. Junctions 16 also have a dopant concentration gradient that terminates abruptly at bottom component 16a. The abrupt dopant concentration gradient termination, together with unevenness of bottom component 16a, cause an undesirable increase in reverse bias current leakage. Reverse bias current leakage causes a drain of power through the integrated circuit when finished, a problem which is at odds with the low power requirements of modem integrated circuit applications.

The abrupt dopant concentration gradient termination at bottom component 16a of junction 16 can affect yield when forming a MOS transistor, in that a high amount of dopants at a greater depth may cause bottom component 16a of junctions 16 to substantially underlap gate region 14. The underlap of junctions below the gate is caused by a process known as outdiffusion. When junction underlap occurs, there is a decrease in the distance between junctions 16. The result of junction underlap is a high threshold voltage, which is the voltage required to cause the MOS transistor to conduct current. A high threshold voltage is generally undesirable in MOS transistors.

One method used in the prior art for solving the problem of excessive junction underlap has been to form polysilicon spacers on the sides of the gate region 14 at the periphery thereof, such as spacers 18 of FIG. 2. Spacers 18 are formed by conventional processes at the edge of gate region 14 prior to PLAD. Spacers 18 further the distance between junctions 16 and prevent junction underlap below gate region 14, thus maintaining a low threshold voltage. Nevertheless, the use of spacers 18 does not solve the problems of reverse bias current leakage. The formation of spacers also adds processing steps and thus throughput time to the integrated circuit formation process.

From the above discussion, it is seen that a need exists in the art for an improved method of forming shallow junctions on semiconductor substrates. Specifically, an improved method of forming shallow junctions is needed which has the PLAD benefits of shallower junctions with higher concentrations of dopants, without the PLAD constraints of junction underlap, jagged unevenness of the bottom component of the junctions, and abrupt dopant concentration gradient termination. Such an improved method would be an aid in the continued formation of more highly miniaturized and densified integrated circuits.

BRIEF SUMMARY OF THE INVENTION

The present invention seeks to resolve the above and other problems which have been experienced in the art. More particularly, the present invention constitutes an advancement in the art by providing a method of forming shallow junctions on silicon substrates of integrated circuit wafers which achieves each of the objects listed below.

The present invention relates to a method of forming shallow, heavily doped junctions on silicon substrates of integrated circuit wafers in order to provide smaller, more efficient transistors, diodes, resistors, and other semiconductor devices.

The present invention also relates to a method of forming shallow junctions which utilizes PLAD.

The present invention also relates to a method which remedies rough and jagged unevenness of the bottom component of the junctions, abrupt dopant concentration gradient termination of the junctions, and high reverse bias current leakage which results from PLAD formation of junctions.

To achieve the foregoing advantages and, in accordance with the invention as embodied and broadly described herein in the preferred embodiment, a method is provided for forming a shallow junction with a variable profile gradation of dopants.

The method of the present invention comprises providing a semiconductor wafer having a surface on which to form the shallow junction. In one embodiment, the surface comprises a silicon substrate of an in-process integrated circuit wafer and the junction being formed comprises one of a source or a drain of a MOS transistor.

A PLAD operation is conducted to form a shallow, highly doped inner portion of the junction having a high concentration of dopants.

A second doping operation is conducted to form a lightly doped outer portion of the junction. In one embodiment, the doping comprises a conventional ion bombardment implantation doping operation with low power and low dopant dosage. The conventional ion bombardment implantation doping operation is typically conducted with a medium power implanter. The result of the conventional ion bombardment implantation doping operation is a lightly doped outer portion surrounding a heavily doped inner portion. The lightly doped outer portion has a bottom edge that is more even and straight than edges of junctions formed by PLAD. The lightly doped outer portion also has a lower concentration of dopants than the heavily doped inner portion.

The semiconductor wafer is then annealed. The anneal causes a more even distribution of dopant concentration therein and helps to remove imperfections in the internal lattice structure. This anneal is optional and can be conducted after each doping operation, or after any of the doping operations.

The doping operation which forms a heavily doped inner portion and the doping operation which forms a lightly doped outer portion can be conducted in reverse order. This is useful in forming a thin oxide layer over the surface. One application for the thin oxide layer is as an implant barrier to the PLAD operation. When using an implant barrier, a conventional ion bombardment implantation doping operation is conducted first, and then the thin oxide layer is deposited using a process that forms the oxide layer, such as a tetraethyl orthosilicate (TEOS) layer. The PLAD operation is then conducted through the thin oxide layer. Thus, the lightly doped outer portion is formed without the existence of the thin oxide layer, while the thin oxide layer is present to serve as an implant barrier to the PLAD operation. This use of a thin oxide layer as an implant barrier in this embodiment further reduces the depth of the dopants implanted in the PLAD operation, while maintaining the depth of the dopants implanted by the conventional ion bombardment implantation doping operation. The use of a thin oxide layer as an implant barrier also maintains the high concentration of dopants on the surface of the shallow junction in order to form a low resistance contact and interconnect interface.

The result of the method of the present invention is a shallow junction which is useful for forming diodes, resistors, and transistors. The junction has a variable profile gradation of dopants, with a first concentration of dopants in a heavily doped inner portion, and a second, lower concentration of dopants in the deeper lightly doped outer portion. The junction is also formed with an even bottom edge which, along with the variable profile gradation of dopants, helps to eliminate reverse bias current leakage. The variable profile gradation of dopants also helps to reduce underlap, and thereby helps to maintain a low threshold voltage without the need for forming spacers.

The method of the present invention has been found to be easily integrated into the manufacturing flow process and to be relatively inexpensive.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained will be understood, a more particular description of the invention briefly described above will be rendered by reference to specific embodiments thereof which are illustrated in the appended drawings. Understanding that these drawings depict only typical embodiments of the invention and are not, therefore, to be considered limiting of its scope, the invention will be described and explained with additional specificity and detail through the use of the accompanying drawings, which will be briefly described below.

DETAILED DESCRIPTION OF THE PREFERRED EMBODIMENTS

The present invention involves the discovery by the inventors that by creating a shallow junction that has a variable concentration profile gradation of dopants with a PLAD operation, the prior art problems of conventional PLAD processes of jagged unevenness of the bottom component of the junction, excessive underlap of junctions below a MOS gate due to outdiffusion of dopants, and reverse bias current leakage can be remedied. Thus, the present invention comprises a method of forming a shallow junction on a silicon substrate using PLAD, which results in a junction with a variable concentration profile gradation of dopants for the formation of a less abrupt dopant concentration gradient termination at the bottom component of the junction. The term "variable concentration profile gradation of dopants," as used herein, refers to a junction in which different depths of the junction have different concentrations of dopants. Thus, the shallow junction has differing concentrations throughout. In one embodiment, the junction is formed with a heavily doped inner portion having a shallow depth and a high concentration of dopants, around which is formed a lightly doped outer portion having a greater depth and a lower concentration of dopants.

The method of the present invention is illustrated in FIGS. 3 through 6. The first step of the method of the present invention is the preparatory step of providing a semiconductor wafer having a surface on which to form the shallow junction. This is typically conducted at the junction doping stage of conventional integrated circuit manufacturing processes, typically after gate stacks are defined and before a passivation layer is formed over the defined gate stacks. Thus, in the embodiment seen in FIG. 3, a silicon substrate 20 is provided on an in-process integrated circuit wafer.

Figure 1:
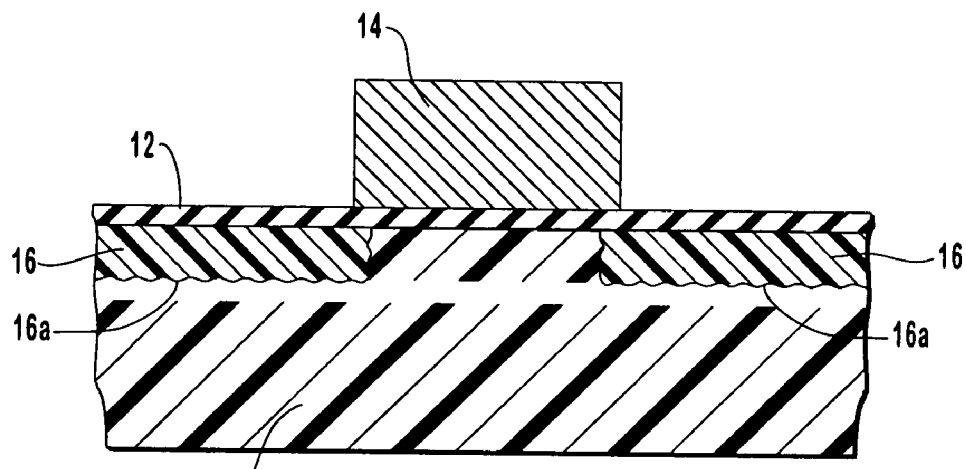
FIG. 1 is a cross-sectional depiction of a portion of an in-process integrated circuit wafer showing the results of a step of a conventional PLAD process of the prior art.
Figure 2:
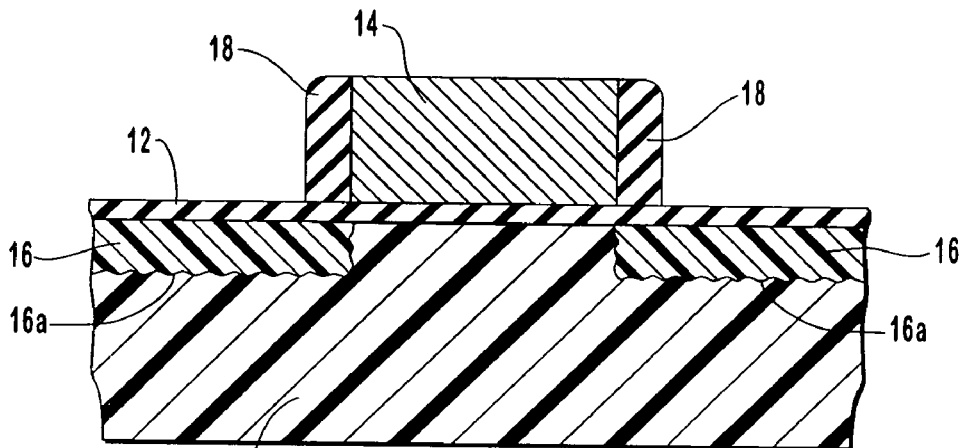
FIG. 2 is a cross-sectional depiction of a portion of an in-process integrated circuit wafer showing the results of a further step of the prior art PLAD process from that depicted in FIG. 1.
Figure 3:
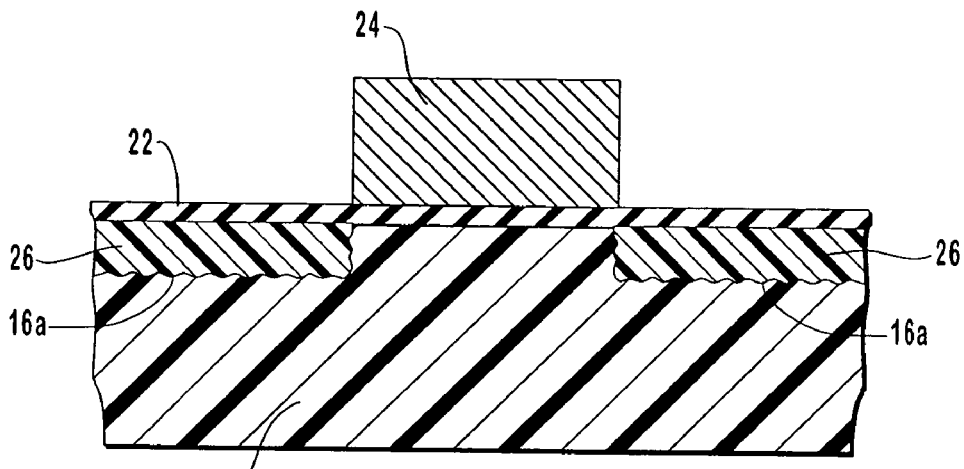
FIG. 3 is a cross-sectional depiction of a portion of an in-process integrated circuit wafer showing the results of a step of the method of the present invention.

In forming the partially completed gate structure of FIG. 3, gate oxide layer 22 is formed over silicon substrate 20. A gate region 24, which is formed over silicon substrate 20 and gate oxide layer 22, leaves exposed portions of silicon substrate 20 on which junctions will be formed.

The next step in the method of the present invention comprises conducting a PLAD operation to dope the exposed portion of silicon substrate 20, producing highly doped inner portions 26 having a depth of less than about 1000 angstroms. The PLAD operation is conducted in an energy range of about 5 KeV to about 15 KeV. Highly doped inner portions 26 will preferably be doped to a dopant concentration range of about $1 \times 10^{19}$ to about $15 \times 10^{21}$ atoms per cm$^3$. Any common dopant, such as boron or phosphorus, can be doped into silicon substrate 20. PLAD process machines are available from Varian Associates of Palo Alto, Calif., USA.

The PLAD operation is followed with a conventional ion bombardment implantation doping operation using dopants of the same type as were used for the PLAD operation. The conventional ion bombardment implantation doping operation is conducted without a plasma. Preferably, the conventional ion bombardment implantation doping operation is conducted at the higher energy range of between about 10 KeV and about 25 KeV using a medium current implanter. A medium current implanter is an implanter which operates in an energy range of about 0 to about 200 KeV, such as the E500 manufactured by Varian Associates of Palo Alto, Calif., USA.

The conventional ion bombardment implantation doping operation results in a set of junctions 30 with lightly doped outer portions 28 which extend to a greater depth than highly doped inner portions 26, and which have a lower concentration of dopants than highly doped inner portions 26. The concentration of dopants of lightly doped outer portions 28 is preferably in a range of about $1 \times 10^{16}$ to about $1 \times 10^{19}$ atoms per cm$^3$. Each of lightly doped outer portions 28 preferably will circumscribe and extend below and beyond corresponding highly doped inner portions 26 by a depth in a range of about 250 angstroms to about 750 angstroms. The conventional ion bombardment implantation doping operation step will increase the dopant concentration in highly doped inner portions 26, and will also create lightly doped outer portions 28.

Due to the capability of conventional ion bombardment implantation doping operations of implanting with a more constant depth than PLAD processes, lightly doped outer portions 28 are formed with an even bottom component, rather than the jagged uneven bottom component formed by conventional PLAD processes. Thus, the lightly doped outer portion has a lower periphery 32, seen in FIG. 4, that is substantially planar and parallel to the silicon substrate.

An optional further step of the method of the present invention comprises annealing junctions 30. This anneal can be accomplished by conventional annealing processes, while conventional rapid thermal annealing (RTA) is preferred. Annealing achieves a normalizing of the doping gradient, helping to more evenly distribute dopants within highly doped inner portions 26 and lightly doped outer portions 28. Annealing can be conducted after one or more of the doping operations.

Figure 4:
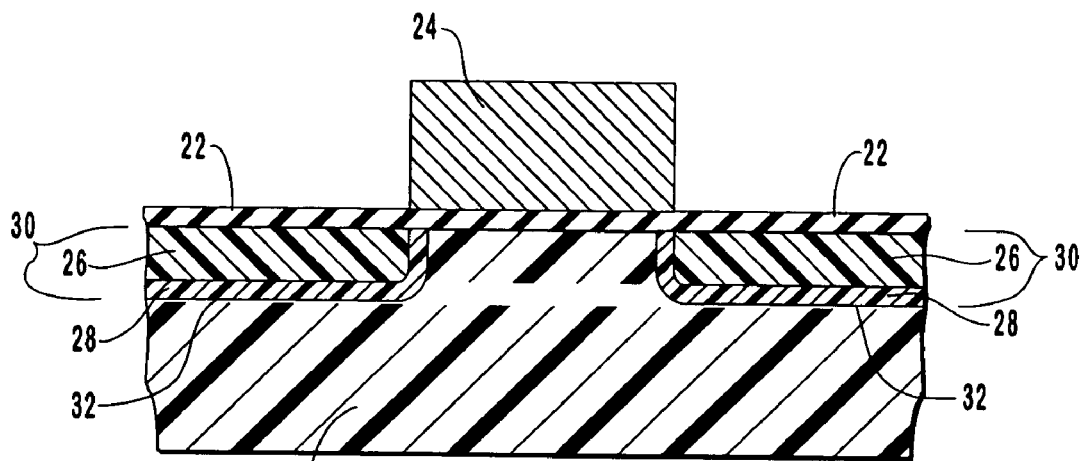
FIG. 4 is a cross-sectional depiction of a portion of an in-process integrated circuit wafer showing the results of a further step of the method of the present invention from that depicted in FIG. 3.

The foregoing steps result in the structure of FIG. 4, in which highly doped inner portions 26 and lightly doped outer portions 28 form junctions 30, each having a variable concentration profile gradation of dopants. As seen therein, lightly doped outer portions 28 slightly underlap gate region 24, but highly doped inner portions 26 do not substantially underlap gate region 24. This allows for a greater concentration of dopants in junction 30, while allowing only a minor portion of all dopants in junction 30 to underlap gate region 24. This helps to maintain a low threshold voltage without the need, as discussed in the Background section above, for spacers on the side of the gate.

The structure of FIG. 4 also produces a less abrupt, more tailored, doping concentration gradation with a variable dopant concentration profile which has been found to reduce reverse bias current leakage. Thus, the use of PLAD allows the formation of a shallow junction with a high dopant concentration close to the surface of silicon substrate 20, which helps to subsequently form lower resistance contacts and interconnects superadjacent thereto, while the method of the present invention eliminates the aforementioned problems with conventional PLAD processes.

Figure 5:
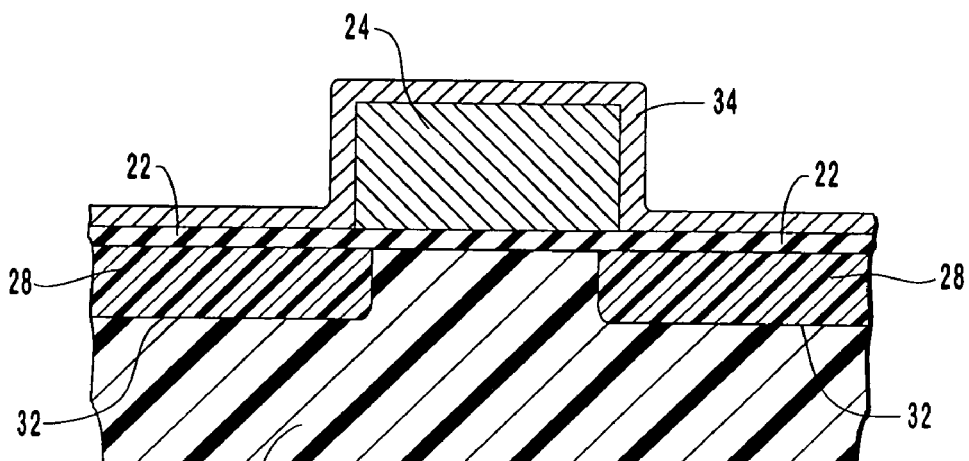
FIG. 5 is a cross-sectional depiction of a portion of an in-process integrated circuit wafer showing the results of a step of an alternative embodiment of the method of the present invention.

In an alternative embodiment, the conventional ion bombardment implantation operation is conducted first to form lightly doped outer portions 28 as are seen in FIG. 5.

Figure 6:
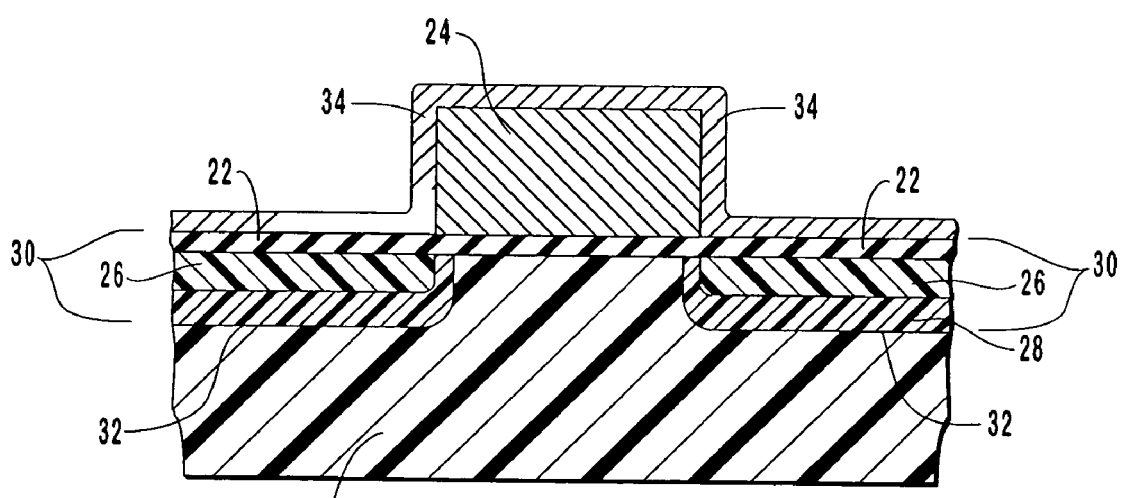
FIG. 6 is a cross-sectional depiction of a portion of an in-process integrated circuit wafer showing the results of a further step of the alternative embodiment of the method of the present invention from that depicted in FIG. 5.

Afterwards, a PLAD operation is conducted to form highly doped inner portions 26 as seen in FIG. 6. As with the embodiment described above, an anneal step can be performed after one or both of these two doping steps.

In the embodiment where the conventional ion bombardment implantation operation is conducted first, a thin oxide layer can be formed over gate region 24 and junction 30 prior to the PLAD operation and after the conventional ion bombardment implantation operation. By way of example, a TEOS (tetraethylorthosilicate) layer 34, as seen in FIG. 5, is formed, preferably having a thickness in a range of about 50 to about 100 angstroms. The PLAD operation is then conducted through TEOS layer 34, such that the structure of FIG. 6 results. When so doing, TEOS layer 34 serves as an implant barrier to the PLAD operation. The use of TEOS layer 34 as an implant barrier further reduces the depth of highly doped inner portions 26 while maintaining the depth of lightly doped outer portions 28. The use of thin gate oxide layer 22 as an implant barrier also maintains the high concentration of dopants on the surface of junctions 30 for subsequent formation of a low resistance contact and interconnect interface.

The process of the present invention is useful in forming structures other than the gate structure of FIG. 6. Thus, in an alternative embodiment, both the conventional ion bombardment implantation operation and the PLAD operation are conducted in either order, with a thin oxide layer such as gate oxide layer 22 present on a surface such as silicon substrate 20 of an in-process integrated circuit wafer, so as to produce a shallow junction with a variable concentration profile gradation of dopants in the surface under the thin oxide layer.

The present invention can be used to form semiconductor devices such as resistors, diodes, and transistors. It is especially useful for forming MOS transistors, and can be used in forming both p-channel and n-channel MOS transistors. The method of the present invention has been found to be easily integrated into the manufacturing flow process and to be relatively inexpensive.

The method of the present invention solves several of the problems existing in conventional PLAD process implementations, and can be used to form a shallow junction with low resistivity for a contact and interconnect interface, such that a more densified and miniaturized integrated circuit can be formed. The method of the present invention also forms a junction with a more desirable variable concentration profile gradation of dopants with a smooth dopant concentration transition throughout the junction, and without significant junction underlap below a gate due to outdiffusion, such that a low threshold voltage is maintained and reverse bias current leakage is substantially reduced.

The method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of forming an electrical structure on a substrate, the method comprising:

performing a first plasma doping (PLAD) operation to form a first doped region in a substrate; and performing a second doping operation, the second doping operation comprising depositing dopants in the first doped region and in a second doped region that is contiguous with and extends below the first doped region, wherein the first doped region has a higher dopant concentration than the second doped region, the second doped region having a lower periphery that is substantially planar and substantially parallel to a top surface of the substrate.

2. The method as defined in claim 1, wherein performing a first PLAD operation to form a first doped region in a substrate comprises performing the first PLAD operation to form the first doped region having a dopant concentration that terminates relatively abruptly at an uneven lower periphery.

3. The method as defined in claim 1, wherein:

performing a first PLAD operation to form a first doped region in a substrate comprises forming the first doped region having a lower periphery at a depth of less than about 1000 Å; and performing a second doping operation comprises forming the second doped region having a lower periphery at a depth that is less than about 1750 Å from the top surface of the substrate and at least about 250 Å greater than the depth of the lower periphery of the first doped region.

4. The method as defined in claim 1, further comprising annealing the substrate after at least one of the second doping operation and the first PLAD operation to cause a more uniform distribution of dopants.

5. The method as defined in claim 4, wherein annealing the substrate comprises rapid thermal annealing of the substrate.

6. The method as defined in claim 1, wherein:

performing a first PLAD operation to form a first doped region in a substrate comprises conducting the first PLAD operation at an energy in a range of from about 5 KeV to about 15 KeV such that the first doped region has a dopant concentration in a range of from about $1 \times 10^{19}$ dopant atoms/cm$^3$ to about $5 \times 10^{21}$ dopant atoms/cm$^3$; and performing a second doping operation comprises performing the second doping operation at an energy in a range of from about 10 KeV to about 25 KeV such that the second doped region has a dopant concentration in a range of from about $1 \times 10^{16}$ dopant atoms/cm$^3$ to about $1 \times 10^{19}$ dopant atoms/cm$^3$, the second doping operation being conducted in a medium power implanter operating in a range of from about 0 KeV to about 200 KeV.

7. The method as defined in claim 1, further comprising forming a portion of an electrical device that is selected from the group consisting of a diode, a resistor, and a transistor with the first doped region and the second doped region.

8. A method of forming an electrical structure on a substrate, the method comprising:

providing a gate region over a substrate, the gate region having a bottom surface;

performing a first plasma doping (PLAD) operation to form a first doped region in the substrate, wherein the first doped region does not underlap the bottom surface of the gate region; and performing a second doping operation, the second doping operation comprising depositing dopants in the first doped region and in a second doped region that is contiguous with and extends below the first doped region, wherein the first doped region has a higher dopant concentration than the second doped region, the second doped region having at least a portion thereof that underlaps the bottom surface of the gate region.

9. The method as defined in claim 8, wherein performing a first PLAD operation to form a first doped region in the substrate comprises forming the first doped region having a dopant concentration that terminates relatively abruptly at an uneven lower periphery.

10. The method as defined in claim 8, wherein:
performing a first PLAD operation to form a first doped region in the substrate comprises forming the first doped region having a lower periphery at a depth of less than about 1000 Å; and
performing a second doping operation comprises forming the second doped region having a lower periphery at a depth that is less than about 1750 Å from a top surface of the substrate and at least about 250 Å greater than the depth of the lower periphery of the first doped region.

11. The method as defined in claim 8, further comprising annealing the substrate after at least one of the second doping operation and the first PLAD operation to cause a more uniform distribution of dopant.

12. The method as defined in claim 11, wherein annealing the substrate comprises performing the annealing as a rapid thermal anneal.

13. The method as defined in claim 8, wherein:
performing a first PLAD operation to form a first doped region in the substrate comprises conducting the first PLAD operation at an energy in a range of from about 5 KeV to about 15 KeV such that the first doped region has a dopant concentration in a range of from about $1 \times 10^{19}$ dopant atoms/cm$^3$ to about $5 \times 10^{21}$ dopant atoms/cm$^3$; and
performing a second doping operation comprises performing the second doping operation at an energy in a range of from about 10 KeV to about 25 KeV such that the second doped region has a dopant concentration in a range of from about $1 \times 10^{16}$ dopant atoms/cm$^3$ to about $1 \times 10^{19}$ dopant atoms/cm$^3$, the second doping operation being conducted in a medium power implanter operating in a range from about 0 KeV to about 200 KeV.

14. The method as defined in claim 8, further comprising forming a portion of an electrical device that is a transistor from the first doped region and the second doped region.

* * * * *

UNITED STATES PATENT AND TRADEMARK OFFICE
CERTIFICATE OF CORRECTION

PATENT NO. : 7,060,599 B2 Page 1 of 1
APPLICATION NO. : 10/804578
DATED : June 13, 2006
INVENTOR(S) : Fernando Gonzalez and Randhir Thakur It is certified that error appears in the above-identified patent and that said Letters Patent is hereby corrected as shown below:

On the title page:
In the section (56) References Cited: delete second occurrence of "Shu Qin, et
OTHER PUBLICATIONS al., "Plasma Immersion Ion Implantation Doping Experiments for Microelectronics," pp. 962-968, J. Vac. Sci. Technol. B 12(2), Mar./Apr. 1994."

In the specification:
COLUMN 2, Line 42, change "modem integrated circuit" to --modern integrated circuit--
COLUMN 6, Line 32, after "portion" insert --28--

In the claims:
CLAIM 3, COLUMN 8, LINE 21, change "1750 Åfrom" to --1750 Å from--

Signed and Sealed this

Second Day of January, 2007

JON W. DUDAS
*Director of the United States Patent and Trademark Office*